United States Patent [19]

Kiewit

[11] 3,787,720

[45] Jan. 22, 1974

[54] SEMICONDUCTOR VIDICON AND PROCESS FOR FABRICATING SAME

[75] Inventor: David A. Kiewit, Santa Monica, Calif.

[73] Assignee: Hughes Aircraft Company, Culver City, Calif.

[22] Filed: Mar. 28, 1973

[21] Appl. No.: 345,631

[52] U.S. Cl... 317/235 R, 317/235 N, 317/235 NA, 313/66, 250/398, 250/515

[51] Int. Cl. ......................... H01l 15/00, H01l 17/00

[58] Field of Search ................ 250/492 A, 398, 515; 317/235 NA, 235 N; 313/66

[56] References Cited

UNITED STATES PATENTS

| | | | |
|---|---|---|---|
| 3,403,284 | 9/1968 | Buck | 315/11 |
| 3,564,309 | 2/1971 | Hoeberecht | 313/66 |
| 3,707,657 | 12/1972 | Veith | 317/235 R |
| 3,737,701 | 6/1973 | Hoeberecht | 313/66 |
| 3,737,702 | 6/1973 | Kovi | 313/66 |
| 3,676,741 | 7/1972 | Forst | 317/234 R |
| 3,676,715 | 7/1972 | Brojdo | 307/304 |

*Primary Examiner*—Martin H. Edlow
*Attorney, Agent, or Firm*—W. H. MacAllister, William J. Bethurum

[57] ABSTRACT

Disclosed is a semiconductor vidicon target structure and process for fabricating same wherein ohmic contact is made to active PN junction image sensing areas of the structure by means of a novel insulating interlayer through which a large plurality of highly packed metal pin connections extend. A very high packing density for these pin connections is achieved by the use of a selective anisotropic etch-out, metal backfill and lap or etch back process on a single crystal insulating wafer to obtain this thin interlayer. This interlayer eliminates the necessity for selective shielding of the vidicon semiconductor target structure with a dielectric coating or the like.

11 Claims, 5 Drawing Figures

SEMICONDUCTOR VIDICON AND PROCESS FOR FABRICATING SAME

FIELD OF THE INVENTION

This invention relates generally to optical image conversion devices employing photosensitive charge storage elements and more particularly to an improved semiconductor vidicon target structure for use in a vidicon camera tube.

BACKGROUND

An image conversion tube commonly employed in television cameras is that known as the vidicon. The operation of the vidicon is well-known in the art, and it involves: (1) the exposure of a photoconductive target to an optical image which alters the electrical characteristics of the target in a pattern corresponding to that of the image, and (2) the scanning of the target by an electron beam to convert the spatial electrical characteristic distribution of the target to a video signal. The vidicon employs the phenomenom of photoconductivity in the target element to transduce the incident light signals into electrical signals, and generally, the requirements of the vidicon target are two-fold: photosensitivity with high quantum efficiency, and a charge storage time greater than approximately 1/30th of a second.

One common type of vidicon structure includes a PN junction area or areas which are formed in selected surface regions of a semiconductor body. For example, silicon planar technology, which is well-known in the art, may be employed to prepare a mosaic array of electrically isolated individual PN junction sensor regions, and this may be accomplished by diffusion through a silicon dioxide ($SiO_2$) mask. During vidicon operation, these sensor regions are scanned by an electron beam while the reverse side of the above-described structure receives a focussed optical image thereon.

In the fabrication of the above-described structure, it is necessary to provide some form of electron beam shield in certain intermediate surface areas of the structure between the PN junction sensor elements (diodes) thereof. That is, if these intermediate semiconductor surface areas are simultaneously exposed to the scanning electron beam along with P type regions of the PN junction sensor diodes, large extraneous currents are generated in the vidicon target structure, and this degrades the image sensing operation thereof.

PRIOR ART

In the fabrication of prior art silicon vidicon target structures of the above type, and using silicon as the vidicon semiconductive material, it was possible to either thermally grow or vapor deposit an electron beam mask of silicon dioxide ($SiO_2$) in order to overcome the above-described problem. This mask could be made sufficiently thick so that electrons impinging thereon would not reach the silicon target substrate. However, when other semiconductive materials such as indium arsenide were used as the target substrate material, it was difficult, if not impossible, to provide a suitable dielectric coating shield on the semiconductive substrate surface to serve the above purpose of shielding selected regions of the vidicon target structure from the impinging electron beam. For example, several attempts have been made to fabricate a germanium diode array vidicon, but these attempts have been impeded by the present state-of-the-art inability to provide a suitable dielectric electron beam shield as previously mentioned.

THE INVENTION

The general purpose of this invention is to provide an improved semiconductive vidicon target structure and process for fabricating same which possesses most, if not all, of the advantages of similarly employed vidicon target structures and processes, while having none of their aforedescribed significant disadvantages. To attain this purpose, a locally conducting single crystal interlayer has been fabricated utilizing a novel anisotropic etchout and metal backfill process. This process provides a plurality of metal pin connections which extend completely through interlayer and which are packed therein at a very high density. The spacing between these pin connections is less than the spacing between the PN junction sensor elements of the vidicon target by a predictable amount; so that using relatively low tolerance alignment procedures, the interlayer may be face bonded to the PN junction image sensor structure of the target. This interlayer serves to shield the displaced areas of the sensor structure intermediate the PN junction elements from a scanning electron beam, while simultaneously coupling this electron beam through the highly packed metal pin interconnections to each of these PN junction sensor elements of the target structure. The above-described composite structure thus eliminates the requirement for providing an electron shield coating on selected surface areas of the target sensor substructure. This single crystal interlayer has further advantages over state-of-the-art ohmic contact layered pin structures per se which utilize glass-clad pins, one of these being that the minimum spacing between pin conductors for the present invention is much less than that of prior art glass-clad pin structures. The latter spacing for these prior art structures is typically on the order of 75 microns, which is too coarse for vidicon targets of the type described. Other advantages which the present invention exhibits relative to prior art vidicon target structures will become apparent in the following description.

Accordingly, an object of the present invention is to provide a new and improved semiconductor vidicon target structure for a camera tube or the like.

Another object of this invention is to provide a vidicon target structure and related fabrication process of the type described which features an improved packing density for a large plurality of electrically isolated ohmic pin connections.

A further object of this invention is to provide a process for fabricating a vidicon target structure in which a relatively low tolerance alignment is required for bonding an ohmic contact interlayer to a PN junction target sensor substructure.

A still further object of this invention is to provide a structure and process of the type described which is suitable for use with a wide range of semiconductive photosensitive materials.

DRAWING

Figure 3:
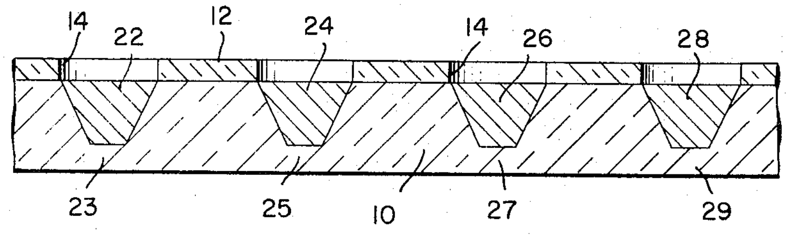
FIG. 3 is a diagrammatic cross-section view of the structure of FIG. 2 after the deposition (backfill) of metal ohmic contact members (pins) in the etched cavities.
Figure 4:
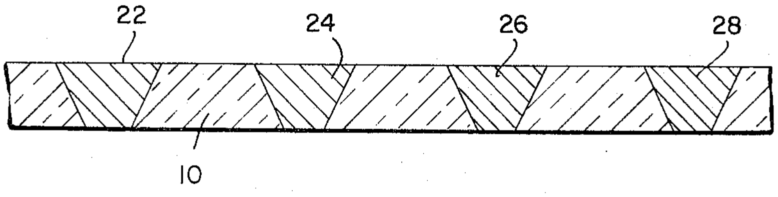
Figure 5:
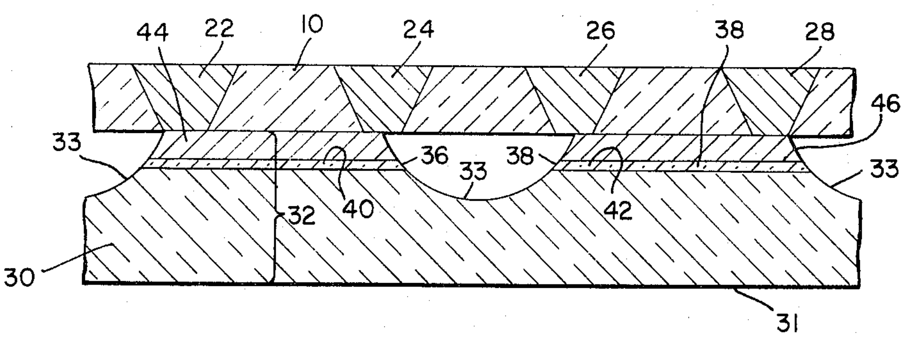

FIG. 4 is a diagrammatic cross-section view of the structure of FIG. 3 after the latter has been either backlapped or back-etched in order to expose the opposited ends of the metal contact pins shown; and FIG. 5 illustrates the relatively low tolerance face-to-face bonding of the vidicon interlayer of FIG. 4 with a previously fabricated semiconductive optical sensor substructure, including spaced PN junction sensor elements on one face thereof.

PROCESS DESCRIPTION

Figure 1:
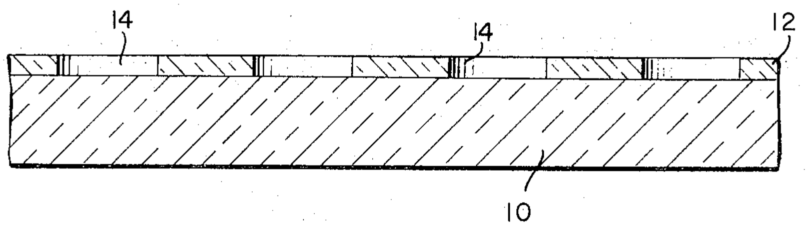
FIG. 1 is a diagrammatic cross-section view of one of the initial masking steps used in the formation of the vidicon interlayer.

Referring now to the drawing, there is shown in FIG. 1 a starting substrate 10 which preferably is a 5 to 8 mil thick wafer of either < 100 > or < 110 > crystallographically oriented semi-insulating single crystal silicon which has a resistivity in excess of $10^8$ ohm·centimeters at 77° Kelvin. The wafer 10 may be prepared by initially doping same with an appropriate impurity, such as gold, copper, or nickel to thereby introduce an energy level into the silicon near the middle of the silicon bandgap. After the substrate 10 has been cleaned and polished on the upper surface thereof, a silicon dioxide ($SiO_2$) mask 12 is formed using standard state-of-the-art photolithographic techniques. Using the latter, a photoresist pattern is first developed on the undeveloped $SiO_2$ mask layer using ultraviolet light, and then a preferential etchant such as a buffered hydrofluoric acid is used to form a plurality of openings 14 in $SiO_2$ mask 12.

Next, the upper surface of the masked structure in FIG. 1 is exposed to a suitable anisotropic etchant such as hydrazine or potassium hydroxide to thereby etch through the silicon substrate 10 and form the cavities 16 with slanted sides 18 and 20. This particular etched geometry illustrated in FIG. 2 will be achieved if the above anisotropic etchants are used with a < 100 > or < 110 > crystallographi-oriented silicon wafer, and the preferential etch rate on such silicon wafer produces a predictable slope on the sides 18 and 20 of the cavities 16 and a cavity depth on the order of about 0.7 times the width of the cavity opening. We have also etched 15 micron deep holes, approximately 21 microns wide (maximum) with a center-to-center spacing of 25 microns. These holes were etched in < 110 > oriented silicon using a mask of rhombic holes etched in the $SiO_2$ mask, and the edges of the rhombuses were parallel to two < 112 > crystallographic directions.

Figure 2:
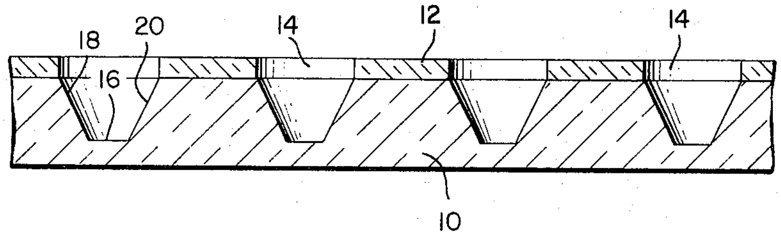
FIG. 2 is a diagrammatic cross-section view of the structure of FIG. 1 after the latter has been anisotropically etched.

Once the cavities 16 have been etched out in the geometry shown in FIG. 2, electroless plating is used to fill these cavities with either nickel or gold, neither of which will adhere to the dielectric $SiO_2$ etch mask 14. By using a well-known electroless nickel process, we have filled four micron deep, 4.5 micron diameter (maximum) cavities that were etched into a < 100 > silicon substrate 10 (with the non-aligned $SiO_2$ mask 12) with the nickel deposits 22, 24, 26 and 28 shown in FIG. 3. Each cavity 16 will be completely filled with the metal, which may even build up slightly higher than the upper surface of the single crystal wafer 10.

Next, the $SiO_2$ mask 12 is removed from the surface of the substrate 10 using a suitable etchant, such as hydrofluoric acid (HF) and then the substrate 10 is either backlapped or back-etched to provide a sufficient stock removal of the underside of the wafer 10 to remove the regions 23, 25, 27 and 29 underlying the nickel (or other metal) deposits 22, 24, 26 and 28, respectively and expose the lower ends of these deposits. Thus, as shown in FIG. 4, the substrate 10 has a plurality of metal elements (referred to herein as pins) which extend completely through the opposite surfaces of the wafer 10 and are very densely spaced in the wafer 10, with a typical pin-to-pin separation on the order of 10 microns.

As an alternative to backlapping the structure in FIG. 3 as mentioned above, an amine etchant (e.g. hydrazine hydrate at 120° C) can be employed for the stock removal of wafer 10, and this etchant does not attack the nickel pin members 22, 24, 26 and 28 in the process. If the metal pins 22, 24, 26 and 28 are formed using either electroless gold plating or a the chemical vapor deposition of wolfram, then a variety of other well-known preferential silicon etchants can be employed in the stock removal step illustrated in FIG. 4 without attacking these pins.

The vidicon target inner layer of FIG. 4 is now ready for face bonding to the elemental diode photosensor array 32 as shown in FIG. 5. This novel vidicon target and sensor structure combination of FIG. 5 relates to at least two existing technologies; namely, diode array image sensing devices and locally conductive target structures. The substantial utility of this novel combination will be better understood by first considering the effect of electron beam scanning the image sensor structure in FIG. 5 without being bonded to and shielded by the inner layer structure of FIG. 4. In this example, an image is projected onto the reverse (lower) surface area 31 of the diode photosensor array and a scanned electron beam is focussed on the upper surfaces (without solder pads 44 and 46) of a plurality of mesa diodes. These diodes are air isolated as shown and include opposite conductivity type mesa regions 36 and 38 which serve to define the PN junctions 40 and 42 of each photosensor diode. Without providing some means of shielding the impinging electron beam from the area 33 of the structure 30 between adjacent photodiodes, the electron beam in this area 33 will generate large extraneous currents in the structure. This scanned electron beam is utilized, of course, to properly reverse bias each of the individual PN junctions 40, 42, etc., in order that they may be read out to re-create the target which is focused on the reverse surface 31 of the sensor structure 30.

Thus, in the prior art of which I am aware, it was necessary to provide some electron beam shielding medium, such as a dielectric semiconductive coating, on the intermediate surface areas 33 which, when unshielded, would respond to the scanned electron beam and generate the above unwanted extraneous currents.

The target inner layer structure of FIG. 4 simultaneously provides the necessary electron beam shielding for these intermediate areas 33 between adjacent PN junction mesas while coupling the scanned electron beam into the diode sensor structure by means of the closely spaced pins 22, 24, 26 and 28. These pins are merely representative of a very large number of densely packed pins in the inner layer structure 10, and a spacing between adjacent pins 22 and 24 on the order of 10 microns may be achieved with the present process. This spacing is less than the spacing between adjacent PN junction mesas 36 and 38 on the target sensor structure 30, and if this inequality is observed, then it is not necessary to precisely register certain indexing elements of the above two structures before soldering them together by use of the solder pads 44 and 46 on the tops of the respective mesas. A conventional type of soldering process may be used for this purpose, and thus the latter features afford a relatively low tolerance alignment procedure which is particularly advantageous in the assembly line fabrication of large numbers of these target structures.

In accordance with the present invention, it is now possible to fabricate indium arsenide and germanium semiconductor structures upon which it has been difficult, if not impossible in the past, to deposit oxide films which would serve the purpose of shielding certain areas of the sensor structure from scanned electron beams. It is known, for example, that attempts have been made to prepare a germanium diode array vidicon and that these attempts have failed because of the developer's inability to provide a suitable dielectric shield on this semiconductive material. As a result of the present invention, however, it is now unnecessary to wait for the development of a suitable matching dielectric film for these as well as other semiconductive materials.

Insofar as the technology of locally conductive structure per se is concerned, there are a variety of prior art techniques capable of fabricating headers and other supporting members which include isolated conducting paths through an insulating medium. But prior art structures of this type known to me use a small number of a relatively widely spaced conductors, and these structures include wire grids which have been clad with glass and cut into pieces of a desired length. These pieces may be cut, for example, at an angle perpendicular to the plane of the wire grid or mesh in order that they may be bonded to other structures in order to provide a desired insulated electrical connection. However, a disadvantage of these prior structures is that the minimum achievable spacing between adjacent conductors is about 75 microns, which is much too coarse for vidicon targets of the type and size described above, and especially those used with low tolerance bonding alignment procedures.

Thus, there has been described above a novel vidicon target structure which may be rather rapidly and economically fabricated in accordance with a novel combination of process steps as disclosed. The inventive process is not limited in its application to any particular photosensitive semiconductive substrate material or to any particular type of masking or anisotropic etching process, or even to any particular crystallographic orientation of the silicon inner layer. Furthermore, a variety of metals may be used in the formation of the densely packed pins which extend through opposing surfaces of the inner layer. Additionally, various forms of bonding may be utilized in place of soldering for the face-to-face electrical contact step illustrated in FIG. 5. For example, metal evaporation techniques may be used to bond the inner layer structure to the diode target structure 30, and this may be accomplished by separately evaporating a suitable metal on the inner layer and sensor structures respectively and then bringing the latter into direct face-to-face contact with each other while these metals are still fluid.

Another process variation which is within the scope of the present invention is that of leaving the $SiO_2$ mask 12 in place during and after backlapping the structure in FIG. 3 to expose both ends of the metal pins 22, 24, 26 and 28. Here, the $SiO_2$ masked interlayer of FIG. 4 will be flipped over so that the image target structure is bonded to the $SiO_2$ masked surface, leaving the $SiO_2$ free side of the interlayer to receive the scanned electron beam. The $SiO_2$ mask will not interfere with the bonding step illustrated in FIG. 5 and the pins will be adequately exposed for soldering to the PN junction mesas as previously described.

Finally, the invention is not limited to any particular geometry for the multielement diode sensor array, and it may be used with any such array wherein the individual PN junction sensor elements are isolated by substrate regions capable of generating extraneous electron beam induced currents and thereby require shielding from the latter.

What is claimed is:

1. A process for fabricating a vidicon target structure including the steps of:

a. forming a mask on a surface of an insulating body;
b. preferentially etching regions of said body exposed by openings in said mask to form cavities in said body of a controlled geometry;
c. depositing a selected metal in said cavities to form a plurality of closely spaced metal pin elements;
d. removing selected regions of said body beneath the deposited metal to thereby expose both ends of each metal deposit, while leaving said metal deposits rigidly intact within said body;
e. providing a photosensitive structure including a plurality of separate PN junction sensor elements spaced apart by predetermined distances; and
f. bonding separate pluralities of said metal pin elements to each of said sensor elements, whereby said insulating body serves as an electron shield for regions of said photosensitive structure intermediate said sensor elements while providing electrical coupling of a scanned electron beam to said sensor elements for scanning an optical image focused on said photo-sensitive structure.

2. The process defined in claim 1 wherein the preferential etching of said insulating body includes exposing regions thereof to an anisotropic etchant for etching said body on a preferred crystallographic plane to form cavities in said body of a predetermined geometry.

3. The process defined in claim 1 wherein the bonding of said metal elements to said PN junction sensor elements includes soldering.

4. The process defined in claim 1 wherein the formation of said metal elements involves electrolessly depositing nickel in said cavities.

5. The process defined in claim 1 wherein said insulating body is a wafer of suitably doped single crystal silicon semiconductive material and said mask is formed thereon by either thermally growing or vapor depositing silicon dioxide on said silicon wafer.

6. The process defined in claim 5 wherein the preferential etching of said insulating body includes exposing regions thereof to an anisotropic etchant for etching said body on a preferred crystallographic plane to form cavities in said body of a predetermined geometry, the bonding of said metal elements to said PN junction sensor elements includes soldering, and the formation of said metal elements involves electrolessly depositing nickel in said cavities.

7. A vidicon target for a camera tube or the like, including in combination:

a. a photosensitive structure responsive to an optical image focused thereon for generating carriers, said structure having a plurality of spaced apart PN junction sensor elements adapted for scanning by an electron beam to properly bias said PN junction sensor elements and enable same to be electronically read out during the recreation of said image;

b. a insulating contact layer including a plurality of electrically isolated metal pins extending therethrough and spaced therein at a relatively high packing density and at separation distances less than the separation distances of said PN junction sensor elements; and c. means for bonding groups of one or more of said metal pins to each of a plurality of said sensor elements, respectively, whereby electrons are shielded from regions of said photosensitive structure intermediate said sensor elements to avoid the generation of extraneous currents in said structure; said layer operatively bonded to said photosensitive structure using relatively low alignment tolerances.

8. The structure defined in claim 7 wherein said contact layer is gold doped single crystal silicon semiconductive material having a resistivity on the order of $10^8$ ohm·centimeter at 77° K and said metal pins are closely spaced nickel contacts extending through said silicon layer.

9. The structure defined in claim 8 wherein said nickel pins are spaced apart on an average of about 10 microns.

10.The structure defined in claim 8 wherein said photosensitive structure is indium arsenide having PN mesa junctions thereon which comprise the PN junction sensor elements of the structure, and said sensor elements bonded to separate pluralities of said nickel contacts.

11. The structure defined in claim 10 wherein said nickel pins are spaced apart on an average of about 10 microns.

* * * * *